United States Patent
Sugiyama

(10) Patent No.: US 10,122,464 B2
(45) Date of Patent: Nov. 6, 2018

(54) OPTICAL MODULE AND OPTICAL TRANSMISSION DEVICE

(71) Applicant: Fujitsu Optical Components Limited, Kawasaki-shi, Kanagawa (JP)

(72) Inventor: Masaki Sugiyama, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 15/252,447

(22) Filed: Aug. 31, 2016

(65) Prior Publication Data

US 2017/0104542 A1 Apr. 13, 2017

(30) Foreign Application Priority Data

Oct. 9, 2015 (JP) .................................. 2015-201566

(51) Int. Cl.
| | |
|---|---|
| *H04B 10/00* | (2013.01) |
| *H04B 10/50* | (2013.01) |
| *H04B 10/516* | (2013.01) |
| *H05K 1/02* | (2006.01) |

(52) U.S. Cl.
CPC ......... *H04B 10/501* (2013.01); *H04B 10/516* (2013.01); *H05K 1/028* (2013.01); *H05K 1/0228* (2013.01)

(58) Field of Classification Search
CPC .... H04B 10/40; H04B 10/503; H04B 10/801; H04B 10/2503; G02F 1/025; G02F 6/4281; G02F 6/42; G02F 6/4246; G02B 1/035; G02B 6/43; G02B 6/4281; G02B 6/4246; G02B 6/4234; G02B 6/4292

USPC ....... 398/135, 136, 137, 138, 139, 164, 183, 398/193, 192, 158, 159, 188, 202, 208, 398/194; 385/88, 89, 90, 92, 93, 94, 14
See application file for complete search history.

(56) References Cited

U.S. PATENT DOCUMENTS

| | | | |
|---|---|---|---|
| 7,306,378 B2 * | 12/2007 | Alduino | G02B 6/4214 385/14 |
| 7,367,715 B1 * | 5/2008 | Budd | G02B 6/4214 385/100 |
| 9,323,014 B2 * | 4/2016 | Levy | G02B 6/425 |

(Continued)

FOREIGN PATENT DOCUMENTS

| | | |
|---|---|---|
| JP | 2012-18289 | 1/2012 |
| JP | 2014-103138 | 6/2014 |

*Primary Examiner* — Hanh Phan
(74) *Attorney, Agent, or Firm* — Staas & Halsey LLP

(57) ABSTRACT

An optical module includes a substrate, a package, and a flexible substrate. The substrate is provided with an electrode. The package includes a housing fixed to the substrate, a receiving unit that optically demodulates a received optical signal to convert the optical signal into a reception electrical signal, an output terminal that is provided on a surface of the housing and outputs the reception electrical signal, an input terminal that is provided at a height from the substrate different from a height of the output terminal and receives a transmission electrical signal, and a transmitting unit that optically modulates the transmission electrical signal received from the input terminal and transmits an optical signal resulting from optical modulation. A flexible substrate has flexibility and includes a signal electrode that connects one of the output terminal and the input terminal to the electrode arranged on the substrate.

12 Claims, 11 Drawing Sheets

(56) References Cited

U.S. PATENT DOCUMENTS

| | | | |
|---|---|---|---|
| 2005/0191057 A1* | 9/2005 | Nakamoto | G02B 6/4201 398/135 |
| 2009/0136236 A1* | 5/2009 | Glebov | G02B 6/4214 398/139 |
| 2012/0008289 A1 | 1/2012 | Aruga et al. | |
| 2014/0056592 A1* | 2/2014 | McColloch | H04B 10/40 398/135 |
| 2014/0140665 A1 | 5/2014 | Akashi et al. | |
| 2014/0147085 A1* | 5/2014 | Lim | G02B 6/428 385/89 |

* cited by examiner

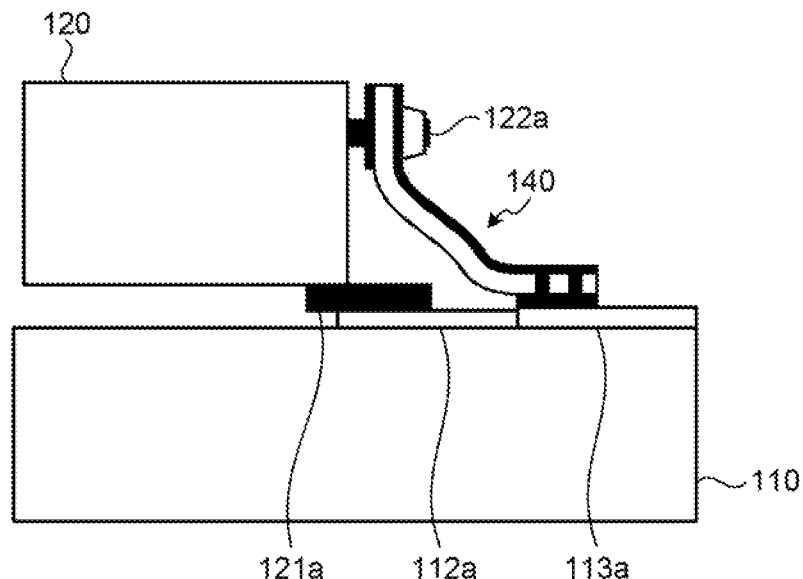
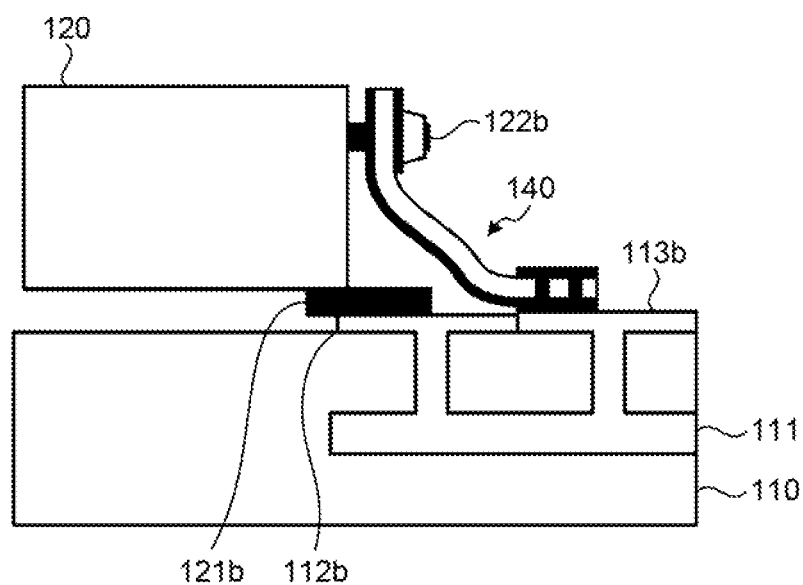

OPTICAL MODULE AND OPTICAL TRANSMISSION DEVICE

CROSS-REFERENCE TO RELATED APPLICATION

This application is based upon and claims the benefit of priority of the prior Japanese Patent Application No. 2015-201566, filed on Oct. 9, 2015, the entire contents of which are incorporated herein by reference.

FIELD

The embodiments discussed herein are related to an optical module and an optical transmission device.

BACKGROUND

With the development of downsized optical modules including an optical modulator, for example, and that mutually convert electrical signals and optical signals, there have been increasing demands for downsized optical transmission devices that transmit and receive optical signals. Furthermore, there have also been increasing demands for large-capacity optical transmission devices having a baud rate of 64G baud, for example.

Examples of such optical transmission devices include, but are not limited to, optical transmission devices that perform coherent optical communications. The optical transmission devices that perform coherent optical communications transmit and receive two polarized-wave components of light from a light source with an I-channel signal and a Q-channel signal superimposed thereon, for example. The optical transmission devices have high-speed signal connections of four channels for transmission and four channels for reception, that is, a total of eight channels. In a case where differential signals are used as the I-channel signal and the Q-channel signal, the number of high-speed signal connections is 16 channels, which is twice as many as eight channels.

As described above, the optical transmission devices have high-speed signal connections of a number of channels. Therefore, the optical transmission devices may be downsized by integrating the transmission function and the reception function into a single optical module.

[Patent document 1]: Japanese Laid-open Patent Publication No. 2012-18289

[Patent document 2]: Japanese Laid-open Patent Publication No. 2014-103138

The optical module in which the transmission function and the reception function are integrated has large cross talk between wiring. Specifically, the optical module includes terminals corresponding to eight channels or 16 channels. The wiring connected to the terminals transmits high-speed signals of 32G baud or higher, for example. As a result, a number of terminals and wiring that transmit the high-speed signals are arranged close to each other, thereby causing cross talk.

Power of transmission electrical signals received by the optical module is substantially ten times the magnitude of power of reception electrical signals output from the optical module. In a case where the terminals and the wiring for the transmission electrical signals are arranged close to those for the reception electrical signals, cross talk caused by the transmission electrical signals serves as noise not negligible for the reception electrical signals.

SUMMARY

According to an aspect of an embodiment, an optical module includes: a substrate on which an electrode is arranged; a package; and a flexible substrate. The package includes: a housing fixed to the substrate; a receiving unit that optically demodulates a received optical signal to convert the optical signal into a reception electrical signal; an output terminal that is provided on a surface of the housing and that outputs the reception electrical signal obtained by the receiving unit; an input terminal that is provided at a height from the substrate different from a height of the output terminal and that receives a transmission electrical signal; and a transmitting unit that optically modulates the transmission electrical signal received from the input terminal and transmits an optical signal resulting from optical modulation. The flexible substrate has flexibility and includes a signal electrode that connects a first terminal of the output terminal and the input terminal to the electrode arranged on the substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B are side schematics of the configuration of the optical module according to the first embodiment;

DESCRIPTION OF EMBODIMENTS

Preferred embodiments of the present invention will be explained with reference to accompanying drawings. The embodiments are not intended to limit the present invention.

[a] First Embodiment

Figure 1:
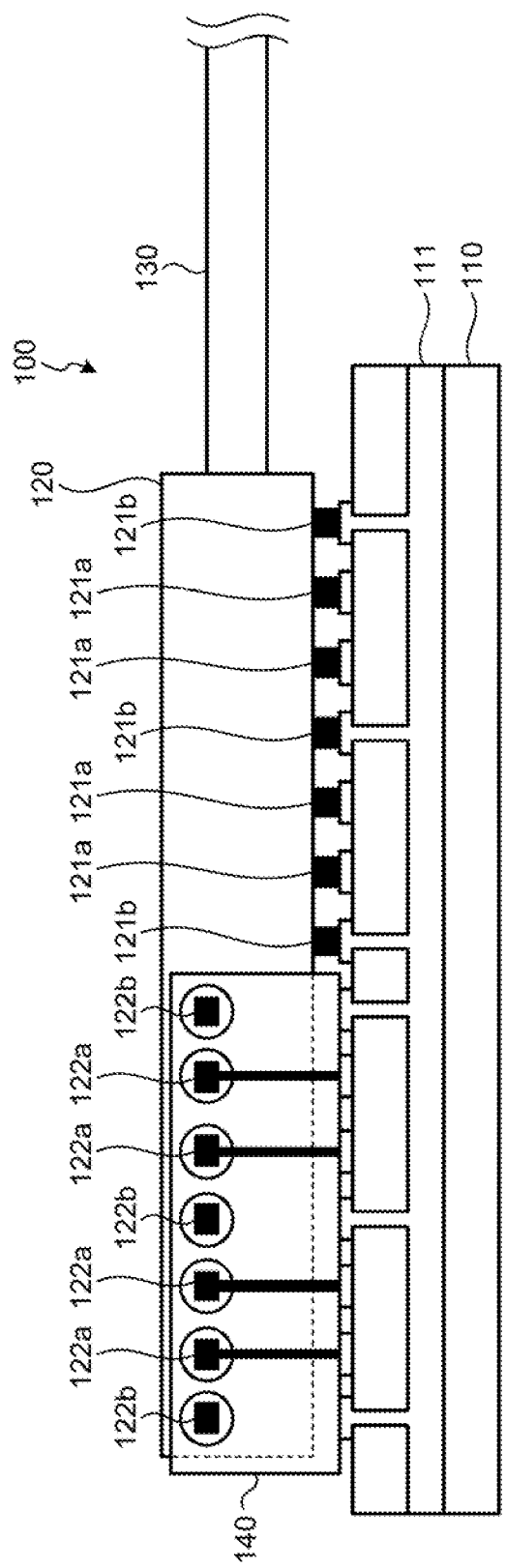
FIG. 1 is a front schematic of a configuration of an optical module according to a first embodiment.

FIG. 1 is a front schematic of a configuration of an optical module 100 according to a first embodiment. The optical module 100 illustrated in FIG. 1 includes a printed circuit board (PCB) 110, a package 120, optical fibers 130, and a flexible printed circuit (FPC) 140. The optical module 100 converts transmission electrical signals received from a driver, which is not illustrated, into optical signals and transmits them. The optical module 100 also converts received optical signals into reception electrical signals and outputs them.

The PCB 110 is a glass epoxy board, for example, and is a part serving as a board on which various parts constituting the optical module are mounted. The surface layer of the PCB 110 can be provided with printed electrodes that electrically connect the various parts. An inner layer of the PCB 110 is provided with a ground electrode 111 having a ground voltage. The ground electrode 111 is connected to ground electrodes on the surface layer of the PCB 110.

The package 120 accommodates parts that mutually convert electrical signals and optical signals in one housing. Specifically, the package 120 includes a transmitting chip and a receiving chip in the housing fixed to the PCB 110. The transmitting chip modulates light from a light source with the transmission electrical signals to generate optical signals. The receiving chip demodulates received optical signals to generate the reception electrical signals.

Output leads 121a that output the reception electrical signals generated by the receiving chip protrude from the lower front surface of the housing of the package 120. The output leads 121a for two channels are provided because differential signals of an I-channel and a Q-channel are output as the reception electrical signals. The output leads 121a of the respective channels are sandwiched between ground leads 121b connected to the ground electrodes. In other words, two output leads 121a are arranged between the ground leads 121b on the left end and at the center and the ground leads 121b on the right end and at the center. The leads 121a and 121b are soldered to the signal electrodes and the ground electrodes, respectively, printed on the surface layer of the PCB 110. In other words, the output leads 121a are soldered to the signal electrodes, and the ground leads 121b are soldered to the ground electrodes.

Input leads 122a that transmit the transmission electrical signals to the transmitting chip protrude from the upper front surface of the housing of the package 120. In other words, the input leads 122a are provided at positions higher than those of the output leads 121a. The input leads 122a for two channels are provided because differential signals of the I-channel and the Q-channel are input as the transmission electrical signals. The input leads 122a of the respective channels are sandwiched between ground leads 122b connected to the ground electrodes. In other words, two input leads 122a are arranged between the ground leads 122b on the left end and at the center and the ground leads 122b on the right end and at the center. The leads 122a and 122b extend through the through holes in the FPC 140, which will be described later, and are soldered to signal electrodes and ground electrodes, respectively, provided on the FPC 140.

The optical fiber 130 transmits and receives optical signals to and from another optical transmission device, for example. In other words, the optical fiber 130 transmits optical signal output from the package 120 to another optical transmission device, for example. The optical fiber 130 transmits optical signals transmitted from another transmission device, for example, to the package 120.

The FPC 140 is a flexible substrate having flexibility and supplies the transmission electrical signals output from the driver, which is not illustrated, to the package 120. In other words, the FPC 140 includes a plurality of signal electrodes and a plurality of ground electrodes and transmits the transmission electrical signals to the package 120 via the signal electrodes. Specifically, the signal electrodes and the ground electrodes of the FPC 140 are soldered to the signal electrodes and the ground electrodes, respectively, on the surface layer of the PCB 110 on one end of the FPC 140. The through holes through which the leads 122a and 122b of the package 120 extend are formed on the other end of the FPC 140. The signal electrodes and the ground electrodes of the FPC 140 are soldered to the leads 122a and 122b, respectively. In other words, the signal electrodes are soldered to the input leads 122a, and the ground electrodes are soldered to the ground leads 122b.

The signal electrodes are provided on the surface of the FPC 140 farther from the package 120, whereas the ground electrodes are provided on the surface of the FPC 140 closer to the package 120. In other words, the signal electrodes and the ground electrodes of the FPC 140 serve as a micro-strip line.

FIGS. 2A and 2B are side schematics of the configuration of the optical module 100 according to the first embodiment. FIG. 2A is a schematic of connection of a signal electrode. As illustrated in FIG. 2A, the output lead 121a that outputs the reception electrical signals protrudes from the lower portion of the package 120 and is soldered to a signal electrode 112a on the surface layer of the PCB 110. The input lead 122a that receives the transmission electrical signals protrudes from the upper portion of the package 120, extends through the through hole of the FPC 140, and is soldered to the signal electrode of the FPC 140. The signal electrode of the FPC 140 is provided on the surface of the FPC 140 farther from the package 120. The upper end and the lower end of the FPC 140 are provided with pads (or lands) extending to both surfaces of the FPC 140. The signal electrode is connected to the pad (or the land).

The pad on the lower end of the FPC 140 is soldered to a signal electrode 113a on the surface layer of the PCB 110. With this configuration, the transmission electrical signals output from the driver, which is not illustrated, are received by the package 120 via the signal electrode 113a and the signal electrode of the FPC 140. The output lead 121a for the reception electrical signals and the input lead 122a for the transmission electrical signals are separately provided at different heights from the PCB 110. This configuration can reduce cross talk occurring near the input and output terminals of the package 120.

FIG. 2B is a schematic of connection of a ground electrode. As illustrated in FIG. 2B, the ground lead 121b that sandwiches the output leads 121a protrudes from the lower portion of the package 120 and is soldered to a ground electrode 112b on the surface layer of the PCB 110. The ground lead 122b that sandwiches the input leads 122a protrudes from the upper portion of the package 120, extends through the through hole of the FPC 140, and is soldered to the ground electrode of the FPC 140. The ground electrode of the FPC 140 is provided on the surface of the FPC 140 closer to the package 120. The upper end and the lower end of the FPC 140 are provided with pads (or lands) extending to both surfaces of the FPC 140. The ground electrode is connected to the pad (or the land).

The pad on the lower end of the FPC 140 is soldered to a ground electrode 113b on the surface layer of the PCB 110. The ground electrodes 112b and 113b are connected to the ground electrode 111 arranged in the inner layer of the PCB 110. With this configuration, the surface of the FPC 140 closer to the package 120 is covered with the ground electrode having a ground voltage. The ground electrode can shield the signal electrode of the FPC 140 from the signal electrode 112a on the surface layer of the PCB 110. As a result, this configuration can reduce cross talk occurring between the transmission electrical signals transmitted by the signal electrode of the FPC 140 and the reception electrical signals transmitted by the signal electrode 112a on the surface layer of the PCB 110.

As illustrated in FIG. 1 and FIGS. 2A and 2B, the output lead 121a and the input lead 122a are separately provided at different heights from the PCB 110 on the front surface of the housing of the package 120. With this configuration, the wiring for the transmission electrical signals can be separated from the wiring for the reception electrical signals. Even when the power of the transmission electrical signals is large, this configuration can reduce cross talk occurring in the wiring for the reception electrical signals. Furthermore, the leads having especially large cross talk are spatially separated, thereby suppressing cross talk more reliably. As a result, this configuration can reduce noise in the reception electrical signals caused by cross talk due to the transmission electrical signals.

Figure 3:
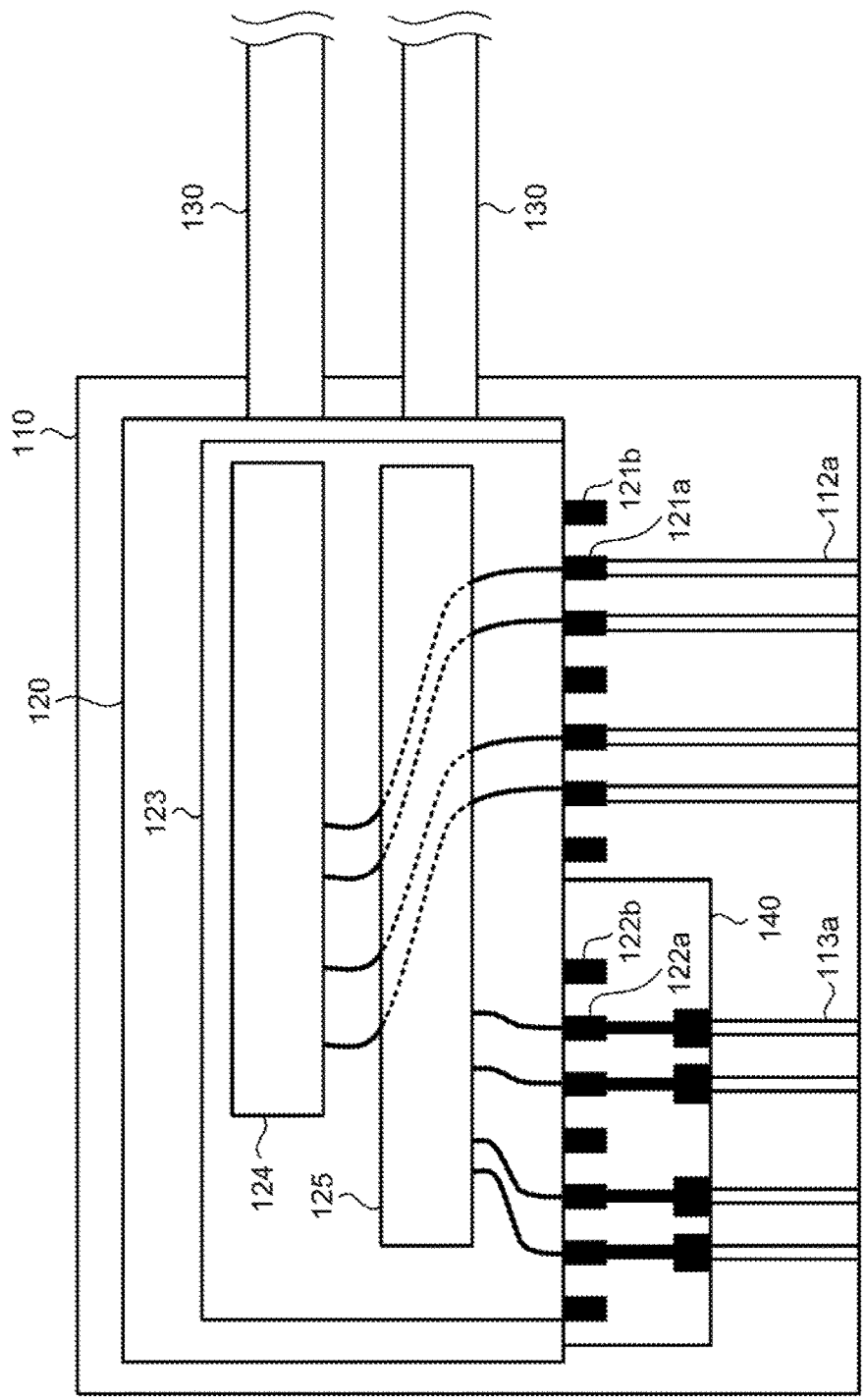
FIG. 3 is a plan schematic of the configuration of the optical module according to the first embodiment.

FIG. 3 is a plan schematic of the configuration of the optical module 100 according to the first embodiment. As illustrated in FIG. 3, the package 120 includes a receiving chip 124 and a transmitting chip 125 mounted on a carrier 123. The receiving chip 124 includes an optical demodulator, and the transmitting chip 125 includes an optical modulator.

The receiving chip 124 receives optical signals transmitted by the optical fiber 130. The receiving chip 124 optically demodulates the optical signals to convert them into reception electrical signals and outputs the reception electrical signals to the output leads 121a. By contrast, the transmitting chip 125 optically modulates the transmission electrical signals received from the input leads 122a to convert them into optical signals and outputs the optical signals to the optical fiber 130. Because the input leads 122a are provided at positions higher than those of the output leads 121a of the package 120, the transmitting chip 125 is arranged at a position higher than that of the receiving chip 124. Wiring that connects the receiving chip 124 and the output leads 121a is provided in an inner layer of the carrier 123 so as to extend under the transmitting chip 125. With this configuration, the transmitting chip 125 can be positioned closer to the leads than the receiving chip 124. This configuration can shorten the wiring that transmits the transmission electrical signals in the package 120. As a result, this configuration can reduce transmission loss of the transmission electrical signals and broaden the transmission band.

The output leads 121a connected to the receiving chip 124 are directly soldered to the respective signal electrodes 112a on the surface layer of the PCB 110. By contrast, the input leads 122a connected to the transmitting chip 125 are soldered to the respective signal electrodes of the FPC 140 at the through holes formed on one end of the FPC 140. The signal electrodes of the FPC 140 are soldered to the respective signal electrodes 113a on the surface layer of the PCB 110 on the other end of the FPC 140.

As described above, the input leads of the package according to the present embodiment are provided at positions higher than those of the output leads. The output leads are directly soldered to the PCB, whereas the input leads are connected to the PCB via the FPC. With this configuration, the input terminals of the package can be spatially separated from the output terminals. As a result, this configuration can suppress cross talk occurring between the wiring that transmits the transmission electrical signals and the wiring that transmits the reception electrical signals.

As illustrated in FIGS. 2A and 2B and FIG. 3, a first end of the FPC 140 according to the first embodiment is soldered to the signal electrodes 113a and the ground electrodes 113b on the surface layer of the PCB 110 at a position farther from the package 120. Alternatively, the first end of the FPC 140 may be soldered to the signal electrodes 113a and the ground electrodes 113b on the surface layer of the PCB 110 at a position closer to the package 120. In this case, the FPC 140 may extend along the front surface of the housing of the package 120. Even if the FPC 140 extends along the front surface of the housing of the package 120, cross talk occurring between the input leads and the output lead can be reduced because the leads having especially large cross talk are separated.

[b] Second Embodiment

A second embodiment overlaps the positions of the input leads and the output leads in the array direction, thereby downsizing the package.

Figure 4:
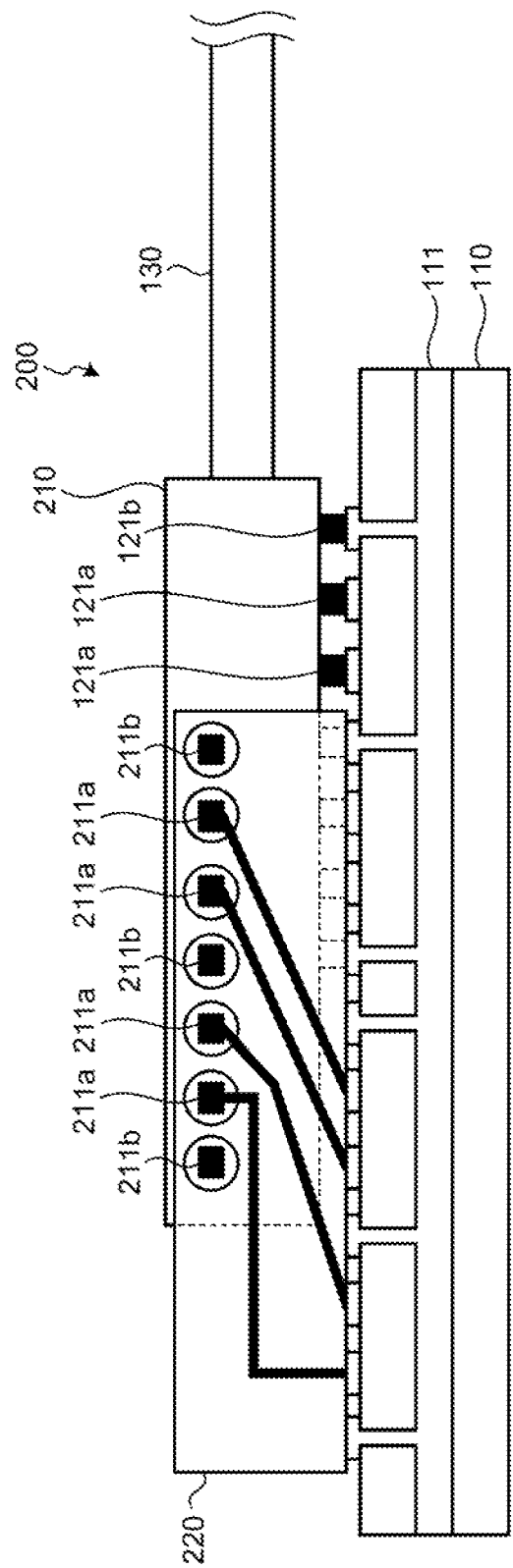
FIG. 4 is a front schematic of a configuration of an optical module according to a second embodiment.

FIG. 4 is a front schematic of a configuration of an optical module 200 according to the second embodiment. In FIG. 4, the same components as those in FIG. 1 are denoted by same reference numerals, and explanation thereof will be omitted. The optical module 200 illustrated in FIG. 4 includes a package 210 and an FPC 220 instead of the package 120 and the FPC 140, respectively, of the optical module 100 illustrated in FIG. 1.

The package 210 includes a transmitting chip and a receiving chip. The transmitting chip modulates light from a light source with the transmission electrical signals to generate optical signals. The receiving chip demodulates received optical signals to generate the reception electrical signals. The output leads 121a and the ground leads 121b protrude from the lower front surface of the housing of the package 210 and are soldered to the respective electrodes on the surface layer of the PCB 110.

Input leads 211a that transmit the transmission electrical signals to the transmitting chip protrude from the upper front surface of the housing of the package 210. In other words, the input leads 211a are provided at positions higher than those of the output leads 121a. The input leads 211a for two channels are provided because differential signals of the I-channel and the Q-channel are input as the transmission electrical signals. The input leads 211a of the respective channels are sandwiched between ground leads 211b connected to the ground electrodes. In other words, two input leads 211a are arranged between the ground leads 211b on the left end and at the center and the ground leads 211b on the right end and at the center. The leads 211a and 211b extend through the through holes in the FPC 220, which will be described later, and are soldered to signal electrodes and ground electrodes, respectively, provided on the FPC 220.

A plurality of leads 121a and 121b and a plurality of leads 211a and 211b are separately provided at different heights from the PCB 110 on the front surface of the housing of the package 210. The arrangement range of the leads 121a and 121b, however, overlap with that of the leads 211a and 211b in a direction parallel to the surface of the PCB 110. In other words, at least part of the leads 211a and 211b are arranged above at least part of the leads 121a and 121b in an overlapping manner.

As described above, the leads 211a and 211b arranged at the upper portion of the package 210 overlap with the leads 121a and 121b arranged at the lower portion of the package 210. This configuration can reduce the width of the package 120 in the direction parallel to the surface of the PCB 110. In other words, this configuration can downsize the package 120.

The FPC 220 is a flexible substrate having flexibility and supplies the transmission electrical signals output from a driver, which is not illustrated, to the package 210. In other words, the FPC 220 includes a plurality of signal electrodes and a plurality of ground electrodes and transmits the transmission electrical signals to the package 210 via the signal electrodes. Specifically, the signal electrodes and the ground electrodes of the FPC 220 are soldered to the signal electrodes and the ground electrodes, respectively, on the surface layer of the PCB 110 on one end of the FPC 220. Through holes through which the leads 211a and 211b of the package 210 extend are formed on the other end of the FPC 220. The signal electrodes and the ground electrodes of the FPC 220 are soldered to the leads 211a and 211b, respectively. In other words, the signal electrodes are soldered to the input leads 211a, and the ground electrodes are soldered to the ground leads 211b.

The signal electrodes of the FPC 220 extend in a direction away from the leads 121a and 121b as they extend from the upper end to the lower end of the FPC 220. This is because the signal electrodes that transmit the transmission electrical signals and the signal electrodes that transmit the reception electrical signals are printed side by side on the surface layer of the PCB 110 while the leads 211a and 211b are arranged in a manner overlapping with the leads 121a and 121b. In other words, the signal electrodes and the ground electrodes printed on the surface layer of the PCB 110 correspondingly to the leads 211a and 211b, respectively, are positioned farther from the leads 121a and 121b than the positions just under the leads 211a and 211b.

As described above, the input leads of the package according to the present embodiment are provided at positions higher than those of the output leads. Furthermore, the arrangement range of the input leads overlap with that of the output leads in a direction parallel to the surface of the PCB. This configuration can reduce the width of the package in the direction parallel to the surface of the PCB, thereby downsizing the package.

The configuration illustrated in FIG. 4 prevents the wiring that transmits the transmission electrical signals from overlapping with the wiring that transmits the reception electrical signals by changing the shape of the signal electrodes of the FPC 220 that transmit the transmission electrical signals. Alternatively, it is also possible to prevent both of the wiring from overlapping with each other by changing the shape of the signal electrodes that transmit the reception electrical signals.

Figure 5:
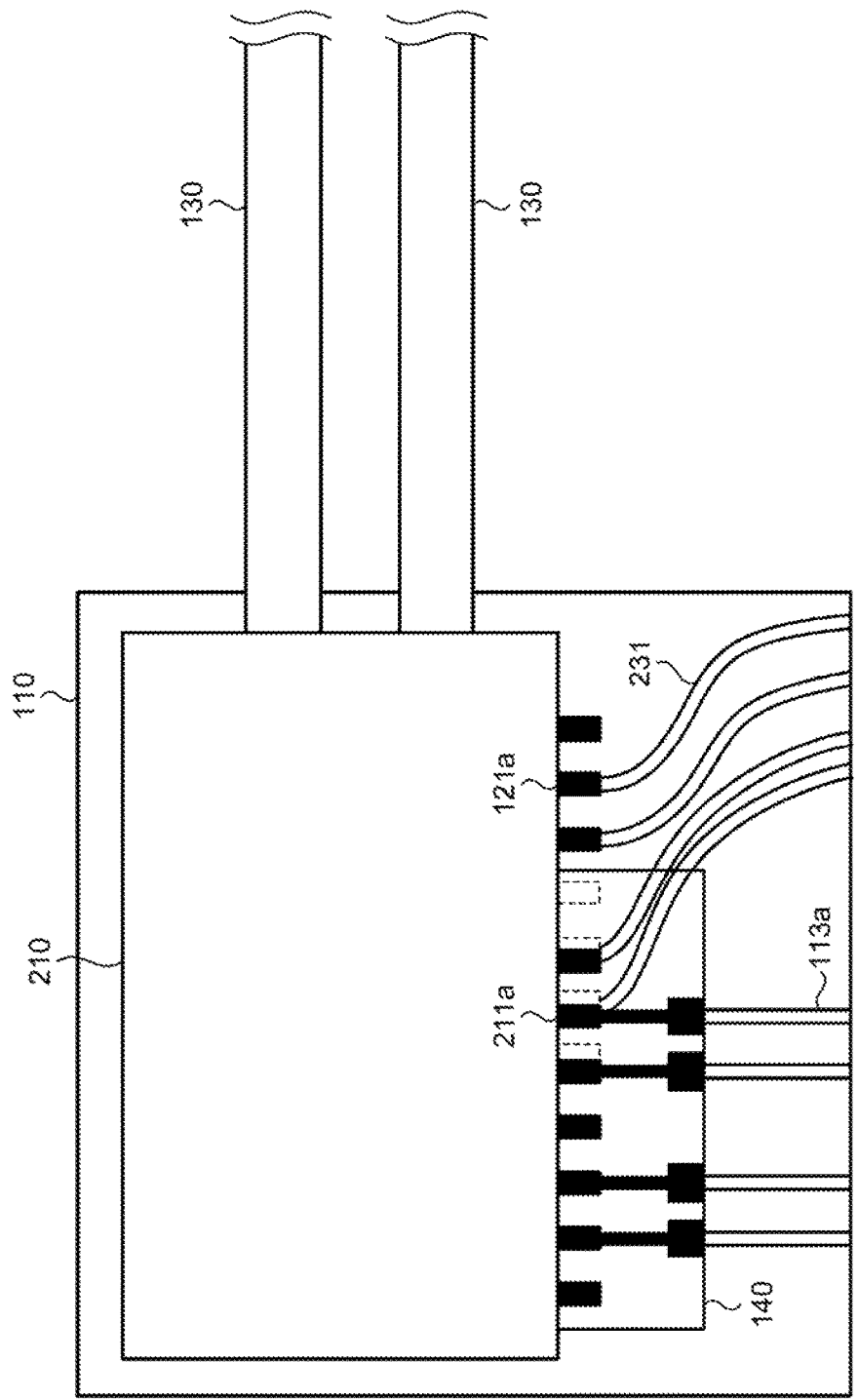
FIG. 5 is a plan schematic of another configuration of the optical module according to the second embodiment.

FIG. 5 is a plan schematic of another configuration of the optical module 200 according to the second embodiment. In FIG. 5, the same components as those in FIGS. 1 and 4 are denoted by same reference numerals, and explanation thereof will be omitted. The optical module 200 illustrated in FIG. 5 includes the FPC 140 identical with that of the optical module 100 illustrated in FIG. 1 instead of the FPC 220 of the optical module 200 illustrated in FIG. 4. Signal electrodes 231 that transmit the reception electrical signals are printed on the surface layer of the PCB 110.

As illustrated in FIG. 5, the signal electrodes 231 extend in a direction away from the input leads 211a as they extend away from the output leads 121a. Specifically, the FPC 140 extends in a direction away from the package 210 as it extends from the input leads 211a arranged on the upper end to the lower end. The signal electrodes 231 are sufficiently away from the input leads 211a outside the projection range of the FPC 140 onto the surface of the PCB 110. This is because the signal electrodes that transmit the transmission electrical signals and the ground electrodes can be provided on the FPC 140 within the projection range of the FPC 140 onto the surface of the PCB 110. As a result, the signal electrodes that transmit the reception electrical signals can be printed on the surface layer of the PCB 110. In other words, the signal electrodes that transmit the transmission electrical signals are printed on the surface layer of the PCB 110 outside the projection range of the FPC 140 onto the surface of the PCB 110. As a result, the signal electrodes 231 are printed at the positions sufficiently away from the signal electrodes.

By changing the shape of the signal electrodes 231 that transmit the reception electrical signals as described above, the FPC 140 having a smaller width than that of the FPC 220 can be used. As a result, this configuration can downsize the package and the FPC.

Figure 6:
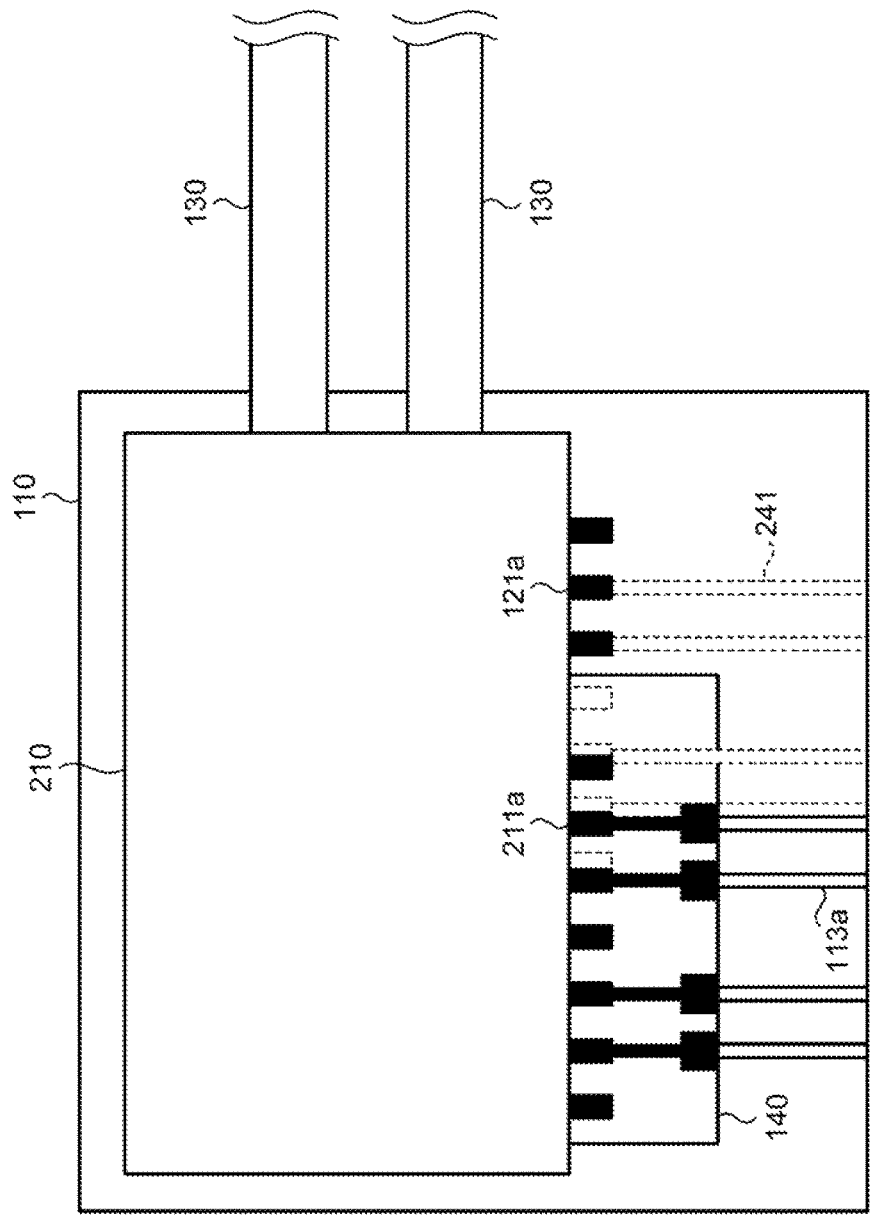
FIG. 6 is a plan schematic of still another configuration of the optical module according to the second embodiment.
Figure 7:
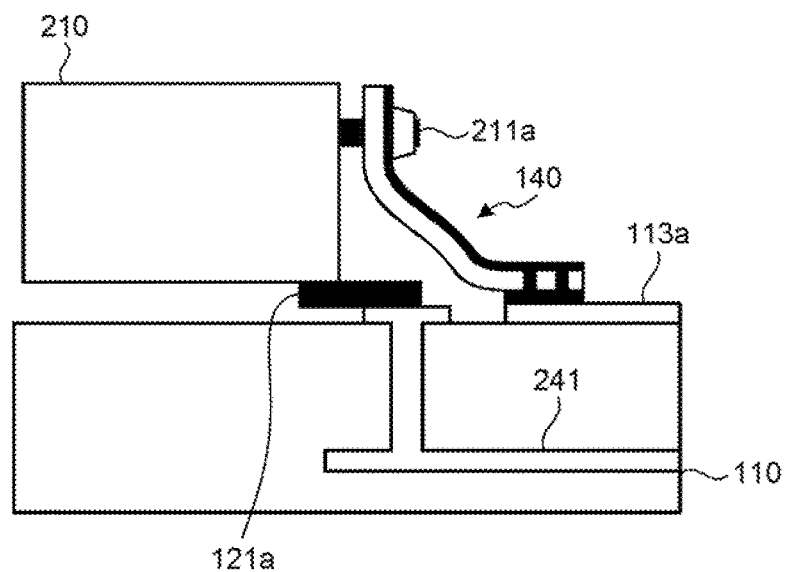
FIG. 7 is a schematic of arrangement of a signal electrode.

As illustrated in FIGS. 6 and 7, signal electrodes 241 may be provided in an inner layer of the PCB 110. In other words, the signal electrodes 113a that transmit the transmission electrical signals are provided on the surface layer of the PCB 110, and the signal electrodes 241 that transmit the reception electrical signals are provided in the inner layer of the PCB 110. The signal electrodes 241 are arranged in a layer different from that of the ground electrode 111 provided in an inner layer of the PCB 110.

As described above, the signal electrodes 241 that transmit the reception electrical signals are provided in an inner layer of the PCB 110. This configuration allows the signal electrodes 113a that transmit the transmission electrical signals to overlap with the signal electrodes 241 that transmit the reception electrical signals, thereby downsizing the PCB besides the package and the FPC.

[c] Third Embodiment

A third embodiment thickens the ground leads connected to the FPC and increases the number thereof to prevent breaking of the signal electrodes of the FPC.

Figure 8:
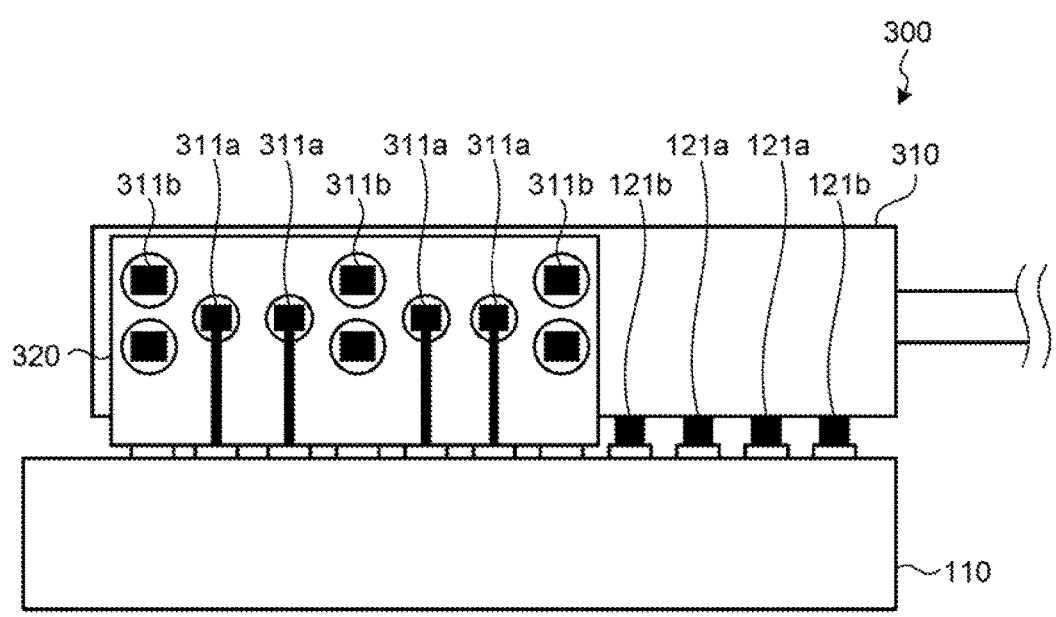
FIG. 8 is a front schematic of a configuration of an optical module according to a third embodiment.

FIG. 8 is a front schematic of a configuration of an optical module 300 according to the third embodiment. In FIG. 8, the same components as those in FIG. 1 are denoted by same reference numerals, and explanation thereof will be omitted. The optical module 300 illustrated in FIG. 8 includes a package 310 and an FPC 320 instead of the package 120 and the FPC 140, respectively, of the optical module 100 illustrated in FIG. 1.

The package 310 includes a transmitting chip and a receiving chip. The transmitting chip modulates light from a light source with the transmission electrical signals to generate optical signals. The receiving chip demodulates received optical signals to generate the reception electrical signals. The output leads 121a and the ground leads 121b protrude from the lower front surface of the housing of the package 310 and are soldered to the respective electrodes on the surface layer of the PCB 110. FIG. 8 illustrates the output leads 121a and the ground leads 121b for one channel alone.

Input leads 311a that transmit the transmission electrical signals to the transmitting chip protrude from the upper front surface of the housing of the package 310. In other words, the input leads 311a are provided at positions higher than those of the output leads 121a. The input leads 311a for two channels are provided because differential signals of the I-channel and the Q-channel are input as the transmission electrical signals. The input leads 311a of the respective channels are sandwiched between ground leads 311b connected to the ground electrodes. In other words, two input leads 311a are arranged between pairs of ground leads 311b aligned in the height direction on the left end and at the center and pairs of ground leads 311b on the right end and at the center.

The ground leads 311b according to the present embodiment have a larger diameter than that of the input leads 311a. Two ground leads 311b protrude from the front surface of the housing of the package 310 in a manner aligned in the height direction. The pairs of ground leads 311b protrude from three positions at substantially the same height on the front surface of the housing of the package 310. The input leads 311a protrude between the pairs of ground leads 311b. As illustrated in FIG. 8, a total of four input leads 311a are provided, whereas a total of six ground leads 311b are provided, which is larger than the total of the input leads 311a.

As described above, a larger number of ground leads 311b having a larger diameter are soldered to the respective ground electrodes at the through holes formed in the FPC 320. With this configuration, the FPC 320 is less likely to be bent at the height where the ground leads 311b are arranged. As a result, portions near the connections between the input leads 311a and the signal electrodes of the FPC 320 are less likely to be bent, thereby preventing breaking of the signal electrodes.

As described above, the ground leads connected to the FPC according to the present embodiment have a larger diameter than that of the input leads. Two ground leads are aligned in the height direction of the package, and the input leads are arranged between the pairs of ground leads. This configuration reinforces the connection between the ground leads and the FPC, thereby suppressing bend of the FPC at the connections between the input leads and the signal electrodes of the FPC. As a result, this configuration can prevent breaking at the connections between the input leads and the signal electrodes of the FPC.

The third embodiment may simply make the diameter of the ground leads 311b larger than that of the input leads 311a or may simply increase the number of ground leads 311b. In both cases, the connection between the ground leads 311b and the FPC is reinforced. As a result, the FPC 320 is less likely to be bent, thereby preventing breaking.

[d] Fourth Embodiment

A fourth embodiment includes a ceramic substrate exposed outside from the package, and the FPC is soldered to terminals on the ceramic substrate. With this configuration, the fourth embodiment makes the pitch between the terminals smaller, thereby downsizing the package.

Figure 9:
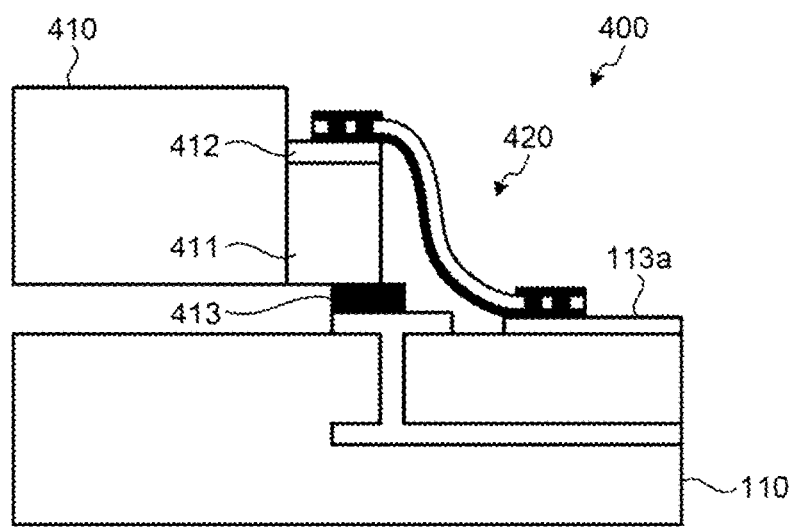
FIG. 9 is a side schematic of a configuration of an optical module according to a fourth embodiment.

FIG. 9 is a side schematic of a configuration of an optical module 400 according to the fourth embodiment. In FIG. 9, the same components as those in FIG. 1 are denoted by same reference numerals, and explanation thereof will be omitted. The optical module 400 illustrated in FIG. 9 includes a package 410 and an FPC 420 instead of the package 120 and the FPC 140, respectively, of the optical module 100 illustrated in FIG. 1.

The package 410 has a transmitting chip and a receiving chip. The transmitting chip modulates light from a light source with the transmission electrical signals to generate optical signals. The receiving chip demodulates received optical signals to generate the reception electrical signals. A ceramic substrate 411 is exposed from the front surface of the housing of the package 410, and an input terminal 412 connected to the transmitting chip is provided on the upper surface of the ceramic substrate 411. An output lead 413 connected to the receiving chip protrudes from the lower portion of the ceramic substrate 411 and is soldered to a signal electrode on the surface layer of the PCB 110. In FIG. 9, the signal electrode to which the output lead 413 is soldered is connected to wiring in an inner layer of the PCB 110 because the reception electrical signals are transmitted by the wiring in the inner layer of the PCB 110.

The FPC 420 is a flexible substrate having flexibility and supplies the transmission electrical signals output from a driver, which is not illustrated, to the package 410. In other words, the FPC 420 includes a plurality of signal electrodes and a plurality of ground electrodes and transmits the transmission electrical signals to the package 410 via the signal electrodes. Specifically, the signal electrodes and the ground electrodes of the FPC 420 are soldered to the signal electrodes and the ground electrodes, respectively, on the surface layer of the PCB 110 on one end of the FPC 420. The signal electrodes are directly soldered to the input terminals 412 provided on the upper surface of the ceramic substrate 411 on the other end of the FPC 420. Similarly, the ground electrodes of the FPC 420 are directly soldered to the terminals provided on the upper surface of the ceramic substrate 411. With this configuration, the FPC 420 requires no through hole or no land around through holes, thereby making the pitch between the terminals corresponding to the signal electrodes and the ground electrodes smaller. As a result, this configuration can reduce the width of the package 410 in the depth direction in FIG. 9.

As described above, the present embodiment includes the input terminals on the upper surface of the ceramic substrate exposed outside from the package and the output lead provided on the lower portion of the ceramic substrate. The signal electrodes of the FPC are directly soldered to the input terminals on the upper surface of the ceramic substrate. With this configuration, the FPC requires no through hole through which the input leads extend, thereby making the pitch between the input terminals smaller. As a result, this configuration can downsize the package.

The signal electrodes according to the fourth embodiment may be arranged on the surface of the FPC 420 closer to the package 410 or the surface farther from the package 410. In both cases, a pad provided on an end of the FPC 420 enables the soldering of the signal electrodes of the FPC 420 to the input terminals provided on the upper surface of the ceramic substrate 411.

In a case where the signal electrodes are arranged on the surface of the FPC 420 farther from the package 410, the surface closer to the package 410 can be covered with the ground electrodes. With this configuration, the ground electrodes shield the signal electrodes of the FPC 420 that transmit the transmission electrical signals from the signal electrodes on the surface layer of the PCB 110 that transmit the reception electrical signals, thereby reducing cross talk.

Furthermore, the ground electrodes covering the surface of the FPC 420 closer to the package 410 may be covered with a resin coverlay, for example. This configuration can further reduce cross talk.

The input and output terminals for electrical signals and the optical fibers 130 according to the embodiments above are connected to respective adjacent side surfaces of the package. The positional relation between the input and output terminals for electrical signals and the optical fibers 130, however, may vary depending on the configuration of the transmitting chip and the receiving chip and the design conditions for the optical module.

Figure 10:
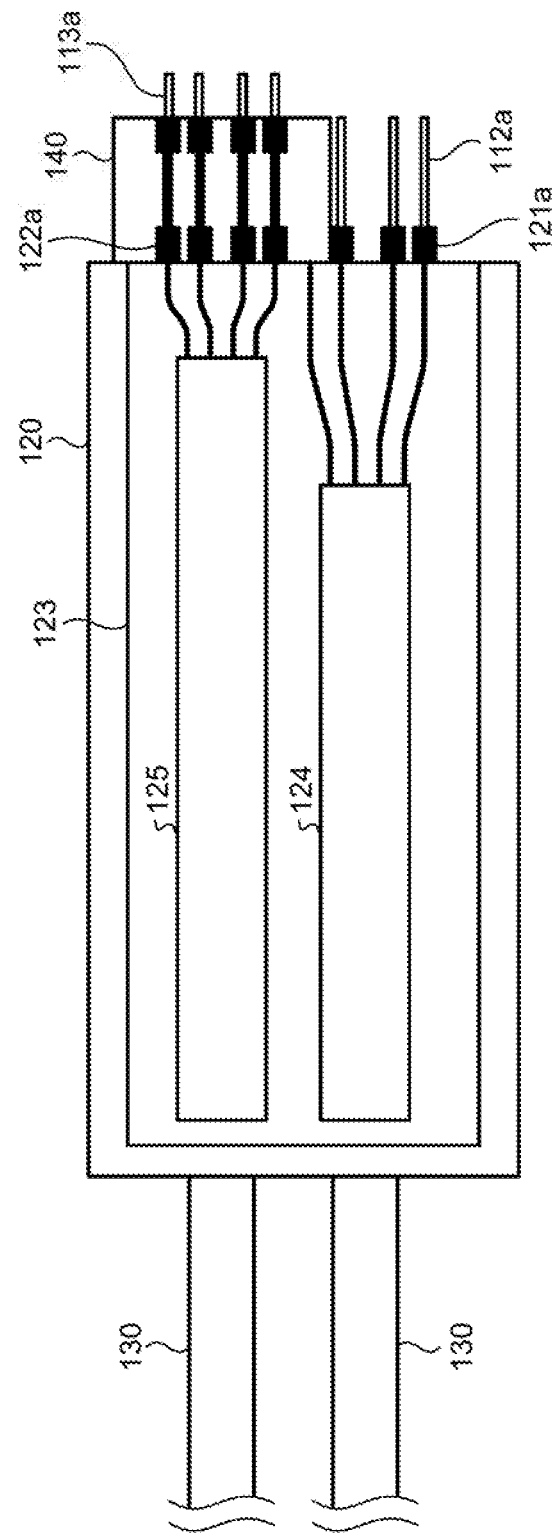
FIG. 10 is a plan schematic of a modification of the optical module.
Figure 11:
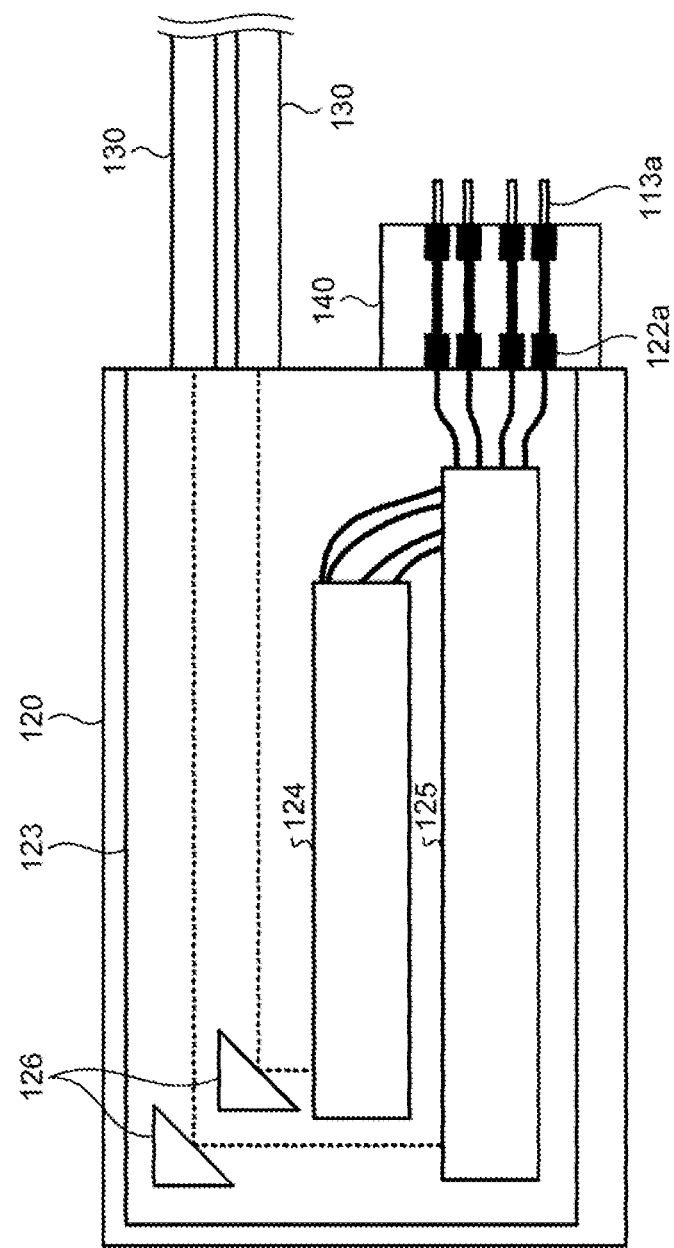
FIG. 11 is a plan schematic of another modification of the optical module.

As illustrated in FIG. 10, for example, the output leads 121a for the reception electrical signals and the input leads 122a for the transmission electrical signals and the optical fibers 130 may be connected to respective facing side surfaces of the package 120. Alternatively, as illustrated in FIG. 11, for example, the output leads 121a for the reception electrical signals and the input leads 122a for the transmission electrical signals and the optical fibers 130 may be connected to a single side surface of the package 120 by changing the traveling direction of the optical signals with prisms 126 provided in the package 120. In FIGS. 10 and 11, the same components as those in FIG. 3 are denoted by same reference numerals.

While the input terminals that receive the transmission electrical signals according to the embodiments above are provided at positions higher than those of the output terminals that output the reception electrical signals on the front surface of the housing of the package, the output terminals may be provided at positions higher than those of the input terminals. In this case, the positional relation between the receiving chip 124 and the transmitting chip 125 in the package may be opposite to that described in the embodiments above. Similarly, the signal electrodes that transmit the transmission electrical signals may be arranged in an inner layer of the PCB 110, and the signal electrodes that transmit the reception electrical signals may be arranged on the surface layer of the PCB 110.

Figure 12:
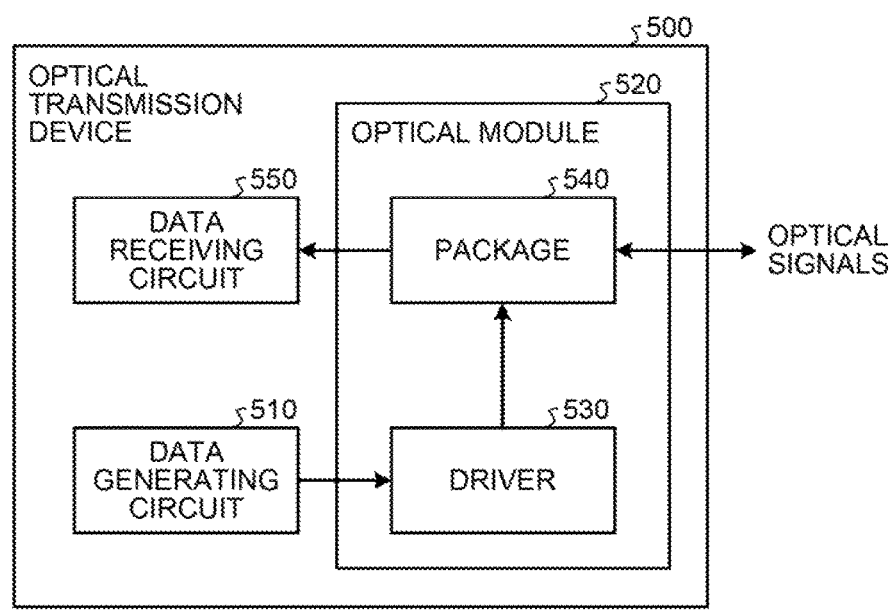
FIG. 12 is a block diagram of an exemplary configuration of an optical transmission device.

The optical modules according to the embodiments above are applicable to an optical transmission device that transmits and receives optical signals, for example. FIG. 12 is a block diagram of an exemplary configuration of an optical transmission device 500.

As illustrated in FIG. 12, the optical transmission device 500 includes a data generating circuit 510, an optical module 520, and a data receiving circuit 550. The optical module 520 includes a driver 530 and a package 540.

The data generating circuit 510 generates transmission data and outputs it to the optical module 520. The transmission data output to the optical module 520 is received by the driver 530 in the optical module 520. The driver 530 generates transmission electrical signals based on the transmission data. The transmission electrical signals are supplied from the driver 530 to the package 540, and the package 540 performs optical modulation based on the transmission electrical signals.

By contrast, optical signals received by the package 540 from the optical fiber are optically demodulated by the package 540. Reception electrical signals resulting from optical demodulation are output to the data receiving circuit 550. The data receiving circuit 550 demodulates and decodes the reception electrical signals, thereby generating reception data.

As described above, the package 540 includes a transmitting chip that performs optical modulation and a receiving chip that performs optical demodulation. The package 540 further includes input terminals and output terminals. The input terminals receive the transmission electrical signals from the driver 530, and the output terminals output the reception electrical signals to the data receiving circuit 550. As described in the embodiments above, the input terminals and the output terminals are separately provided at different heights from the substrate on the package 540. With this configuration, the wiring that transmits the transmission electrical signals is spatially separated from the wiring that transmits the reception electrical signals. As a result, this configuration can suppress cross talk occurring between the wiring.

According to an embodiment of the optical module and the optical transmission device, cross talk can be suppressed.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
   a substrate on which an electrode is arranged;
   a package including:
      a housing fixed to the substrate;
      a receiving unit that optically demodulates a received optical signal to convert the optical signal into a reception electrical signal;
      a plurality of output terminals that are provided on a surface of the housing and that output the reception electrical signal obtained by the receiving unit;
      an input terminal that is provided at a height from the substrate different from a height of the output terminals and at a position overlapping with an arrangement range of the output terminals in a direction parallel to a surface of the substrate, and that receives a transmission electrical signal; and
      a transmitting unit that optically modulates the transmission electrical signal received from the input terminal and transmits an optical signal resulting from optical modulation; and
   a flexible substrate having flexibility and including a signal electrode that connects a first terminal of the output terminals and the input terminal to the electrode arranged on the substrate.

2. The optical module according to claim 1, wherein
   the first terminal is soldered to the signal electrode of the flexible substrate, and
   a second terminal of the output terminals and the input terminal is soldered to the electrode arranged on the substrate.

3. The optical module according to claim 2, wherein the flexible substrate includes a signal electrode soldered to the electrode arranged on the substrate at a position farther from the package than a position at which the second terminal is soldered.

4. The optical module according to claim 1, wherein
   the substrate includes:
      a first electrode electrically connected to a first terminal of the output terminals and the input terminal via the flexible substrate and arranged on a surface layer; and
      a second electrode electrically connected to a second terminal of the output terminals and the input terminal and arranged in an inner layer.

5. The optical module according to claim 1, wherein
   the package further includes a plurality of ground terminals having a ground voltage at positions sandwiching each of the output terminals and the input terminal, and
   the flexible substrate further includes a plurality of ground electrodes connected to the ground terminals on a surface opposite to a surface provided with the signal electrode.

6. The optical module according to claim 5, wherein the package includes a plurality of ground terminals having a larger diameter than a diameter of a first terminal of the output terminals and the input terminal at positions sandwiching the first terminal.

7. The optical module according to claim 5, wherein the package includes a larger number of ground terminals than a total number of a first terminal of the output terminals and the input terminal at positions sandwiching the first terminal.

8. The optical module according to claim 5, wherein the flexible substrate includes the signal electrode on a surface farther from the package and the ground electrode on a surface closer to the package.

9. The optical module according to claim 5, wherein the flexible substrate further includes a coverlay that covers the ground electrode.

10. An optical transmission device comprising:
   an optical transmission member that transmits an optical signal;
   a substrate on which an electrode is arranged;
   a package including:
      a housing fixed to the substrate;
      a receiving unit that optically demodulates the optical signal received from the optical transmission member to convert the optical signal into a reception electrical signal;
      a plurality of output terminals that are provided on a surface of the housing and that output the reception electrical signal obtained by the receiving unit;
      an input terminal that is provided at a height from the substrate different from a height of the output terminals and at a position overlapping with an arrangement range of the output terminals in a direction parallel to a surface of the substrate, and that receives a transmission electrical signal; and
      a transmitting unit that optically modulates the transmission electrical signal received from the input terminal and transmits an optical signal resulting from optical modulation to the optical transmission member; and
   a flexible substrate having flexibility and including a signal electrode that connects a first terminal of the output terminals and the input terminal to the electrode arranged on the substrate.

11. The optical transmission device according to claim 10, wherein the optical transmission member is connected to a surface of the housing of the package opposite to the surface provided with the output terminals.

12. The optical transmission device according to claim 10, wherein the optical transmission member is connected to the surface of the housing of the package provided with the output terminals.

* * * * *